United States Patent [19]

Schroeder

[11] 4,185,246

[45] Jan. 22, 1980

[54] CIRCUIT FOR REDUCING TRANSIENTS BY PRECHARGING CAPACITORS

[75] Inventor: Gene F. Schroeder, Sarasota, Fla.

[73] Assignee: Schlumberger Technology Corporation, Houston, Tex.

[21] Appl. No.: 881,460

[22] Filed: Feb. 27, 1978

[51] Int. Cl.² .................. H03K 1/10; H03K 17/16
[52] U.S. Cl. .................. 328/165; 307/246; 330/107
[58] Field of Search .................. 328/165, 167; 307/247 A, 246; 330/107

[56] References Cited

U.S. PATENT DOCUMENTS

| 3,673,433 | 6/1972 | Kupfer | 307/247 A |
| 3,725,674 | 4/1973 | Schaeffer | 328/165 X |
| 3,795,877 | 3/1974 | Poole | 328/165 X |
| 4,132,908 | 1/1979 | Hughes | 328/165 X |

*Primary Examiner*—John S. Heyman
*Attorney, Agent, or Firm*—William R Sherman; Kevin McMahon; Martin M. Novack

[57] ABSTRACT

A variable filter having a plurality of different loopwidths is disclosed. The variable filter, which is typically employed in a phase locked loop, includes a plurality of capacitors which are switchably coupled into and out of operation in the filter in order to change loopwidths. Those of the capacitors which are not currently operational in the filter are precharged so as to prevent loss of lock in the phase locked loop when switching to another loopwidth.

16 Claims, 3 Drawing Figures

CIRCUIT FOR REDUCING TRANSIENTS BY PRECHARGING CAPACITORS

BACKGROUND OF THE INVENTION

This invention relates to electronic circuits such as variable loopwidth filters wherein different capacitors are switched into and out of operation and, more particularly, to an apparatus and method for reducing transients that result from this switching of capacitors.

The present invention finds particular application in logging-while-drilling of earth boreholes. Logging-while-drilling involves the transmission to the earth's surface of downhole measurements taken during drilling, the measurements generally being taken by instruments mounted just behind the drill bit. One scheme for transmitting the measurements to the earth's surface utilizes drilling fluid within the borehole as a transmission medium for acoustic waves modulated with the measurement information. Typically, drilling fluid or "mud" is circulated downward through the drill string and drill bit and upward through the annulus defined by the portion of the borehole surrounding the drill string. This is conventionally done to remove drill cuttings and maintain a desired hydrostatic pressure in the borehole. In the technique referred to, a downhole acoustic transmitter, known as a rotary valve or "mud siren", repeatedly interrupts the flow of the drilling fluid, and this causes an acoustic carrier signal to be generated in the drilling fluid at a frequency which depends upon the rate of interruption. The acoustic carrier is modulated as a function of downhole digital logging data. In a phase shift keying ("PSK") modulating technique, the acoustic carrier is modulated between two (or more) phase states. Various coding schemes are possible using PSK modulation. In a "non-return to zero" coding scheme, a change in phase represents a particular binary state (for example, a logical "1"), whereas the absence of a change of phase represents the other binary state (for example, a logical "0"). The phase changes are achieved mechanically by temporarily modifying the interruption frequency of the mud siren to a higher or lower frequency until a desired phase lag (or lead) is achieved, and then returning the mud siren to its nominal frequency. For example, if the nominal frequency of the mud siren is 12 Hz., a phase change of 180° can be obtained by temporarily lowering the frequency of the mud siren to 8 Hz. for 125 milliseconds (which is one period at 8 Hz. and one and one-half periods at 12 Hz.) and then restoring the mud siren frequency to 12 Hz. It is readily seen that a 180° phase shift could also be achieved by temporarily increasing the mud siren frequency for an appropriate period of time (i.e., to obtain a desired phase lead), and then returning to the nominal frequency.

The modulated acoustic signal is received uphole by one or more transducers which convert the acoustic signal to an electrical signal. It is then necessary to recover the digital information which is contained in the modulation of the received signal. Briefly, this is achieved by first processing the received signals to extract the carrier signal. The reconstructed carrier is then used to synchronously demodulate the modulated electrical signal.

In the type of system described, a carrier tracking loop is typically employed at the receiver, the purpose of the tracking loop being to lock onto the carrier of the received signals and to produce timing signals that can be used in the demodulation process. It is desirable to acquire a locking onto the carrier as quickly as possible so as to avoid possible loss of information. It is also desirable, once lock is achieved, to have a tracking loop which will be relatively stable; i.e. not adversely affected by short term error component signals in the loop at various frequencies. These two objectives are somewhat at odds, since relatively fast acquisition of lock requires a relatively wide loopwidth whereas stability of the loop would generally dictate a relatively narrow loopwidth. It is known that loopwidth can be manually varied once lock has been achieved, but this technique is not particularly convenient. Also, in the type of logging-while-drilling appratus described above, where relatively low frequency acoustic signals are employed, practical problems arise when attempting to vary the loopwidth of the carrier tracking loop. In particular, the varying of loopwidth generally involves the switching of different capacitors into the loop filter circuit and, at the same time, modifying the loop gain factor. At the frequencies of interest, the capacitors in the circuit generally have relatively large values and are implemented using electrolytic capacitors which provide relatively large capacitance without the undue size which is typical of non-electrolytic capacitors. When a previously inactive capacitor is switched into the circuit, a problem arises due to introduction of an offset voltage which results from the previous voltage across the new capacitor not corresponding to the voltage applied thereacross once it is switched into the circuit.

It is an object of the present invention to provide an improved variable loopwidth filter and circuit for reducing transients when switching capacitors.

SUMMARY OF THE INVENTION

The present invention, in one aspect thereof, is directed to a variable loopwidth filter that is typically utilized in a phase locked loop. The variable filter includes a plurality of capacitors which are switchably coupled into and out of operation in the filter. In accordance with a feature of the invention the variable filter includes means for continuously precharging those of the capacitors which are not currently operational in the filter so as to prevent loss of lock in the phase-locked loop when switching to another loopwidth.

In one form of the variable filter in accordance with the invention, there is provided a first amplifier having first and second input terminals, the first input terminal being adapted to receive an input signal. A second amplifier is also provided, and a variable gain control means switchably couples the output of the first amplifier to an input of the second amplifier. The variable gain control means has at least first and second different gain factors. A variable capacitance means is provided and includes at least first and second capacitors. The variable capacitance means is switchable in concert with the variable gain control means and operates to select one of the first or second capacitors to couple the output of the first amplifier to the second input terminal of the first amplifier. In accordance with an important feature of the invention, means are provided for generating a reference voltage associated with the capacitor which is not currently operative in the variable capacitance means. The generated reference voltage is a function of the voltage which would appear across the capacitor not currently operative in the event it were instantaneously switched into operation. Finally, means are provided for continuously applying the generated reference voltage across the capacitor which is not currently operative. In the preferred form of the described variable filter, the means for generating a reference voltage is responsive to the voltage across the capacitor currently operative in the variable capacitance means, and is also responsive to a ratio of the gain factors.

Further features and advantages of the invention will become more readily apparent from the following detailed description when taken in conjunction with the accompanying drawings.

DESCRIPTION OF THE PREFERRED EMBODIMENT

Figure 1:
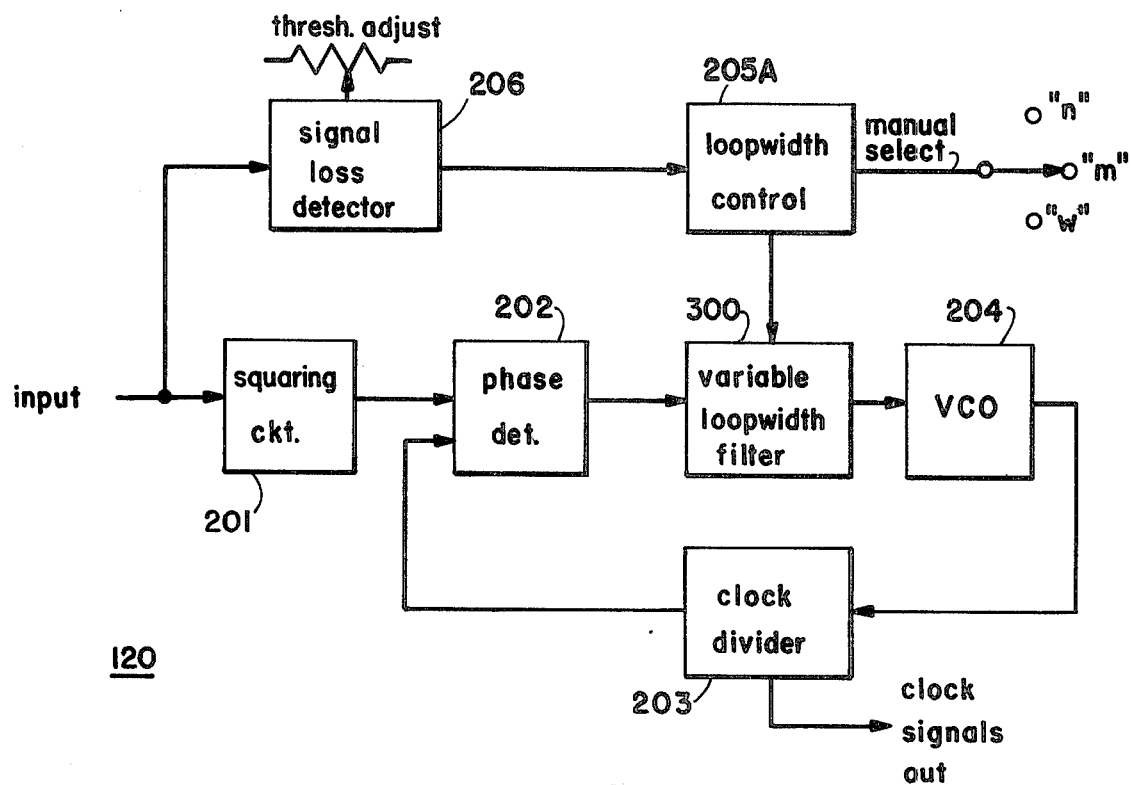
FIG. 1 is a block diagram of a variable loopwidth carrier tracking loop which includes a variable loopwidth filter in accordance with an embodiment of the invention.

Referring to FIG. 1, there is shown an embodiment of the variable loopwidth carrier tracking loop 120 which includes the variable loopwidth filter of the invention which, in turn, includes the capacitor pre-charging circuit of the invention. A squaring circuit 201 receives an input signal, which may be a PSK modulated signal. The squaring operation serves to substantially remove the modulation from the carrier and, in the process, also doubles the frequency of the carrier. The output of squaring circuit 201 is one input to a phase detector 202. The other input to phase detector 202 is the output of a frequency divider (or clock divider) 203. The output of phase detector 202 is coupled to the novel variable loopwidth filter 300, which will be described in detail below. The output of filter 300 is coupled to voltage controlled oscillator (VCO) 204, and the output of VCO 204 is, in turn, coupled to the clock divider 203.

The loopwidth of variable loopwidth filter 300 can be adjusted either manually or automatically under control of a loopwidth control unit 205. In an automatic mode of operation, the loopwidth control unit 205 receives the output of a signal loss detector 206. The signal loss detector 206 includes a comparator which detects loss of lock in the loop by comparing the input signal with an adjustable threshold level. When the input signal is less than the threshold level, a loss of lock is indicated. The loopwidth control unit 205 is responsive to a signal loss indication to effect a loopwidth modification of variable loopwidth filter 300 to a wider loopwidth. When lock has been reacquired, or, for example, after a predetermined time when there will be a high probability that lock has been reacquired, the loopwidth control unit 205 effects a loopwidth modification of variable loopwidth filter 300 to a narrower loopwidth. In the manual mode of operation, switching is under manual control by a switch 205A.

The loopwidth (or bandwidth) of the phase locked loop generally determines the acquisition (or "lock-up") time of the loop, and also determines the stability of the loop; i.e., its ability to maintain lock in the presence of a noisy input. As noted above, a wider loopwidth is advantageous in acquiring lock quickly, but once lock is acquired the wider loopwidth is disadvantageous in that it results in lower stability than a phase locked loop having a narrower loopwidth. It is therefore advantageous to utilize wide loopwidth when acquiring lock, and then switch to a narrower loopwidth after lock is acquired so as to enhance the stability of the loop. In the present invention, modifications of the loopwidth can be performed automatically. An important feature of the invention prevents the switching between different loopwidths from introducing offset voltages in the loop which could cause a loss of lock.

Figure 2:
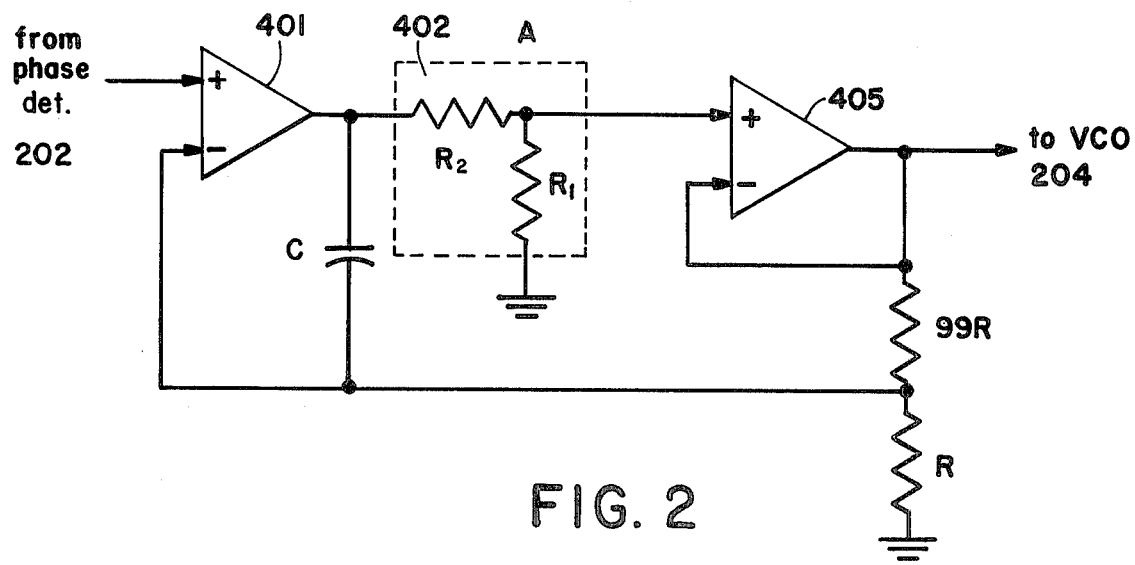
FIG. 2 illustrates a basic loop filter.

To better understand the invention, it is useful to initially consider the basic loopwidth filter illustrated in FIG. 2. The output of phase detector 202 (FIG. 1) is an input to the positive input terminal of an operational amplifier 401. The negative input terminal of the operational amplifier 401 is fed back from the output of the amplifier via a capacitor C. The output of operational amplifier 401 is also coupled, via a gain control resistor network 402 (shown in dashed line), to the positive input terminal of another operational amplifier 405. The gain control network, in this simplified illustration, includes a series resistor designated $R_2$ and a resistor, designated $R_1$, which is coupled to ground reference potential. The output of operational amplifier 405 is fed back to the negative input terminal thereof. The output of operational amplifier 405 is also coupled via a voltage divider, consisting of series resistors labelled 99R and R, to ground reference potential. The junction between the resistors of the voltage divider is coupled back to the negative input terminal of the operational amplifier 401. The transfer function of the loopwidth filter of FIG. 2 is $$F(S) = \frac{A(S + 1/RC)}{(S + A/100RC)}$$

When integrated into the phase locked loop of FIG. 5, the closed-loop transfer function may be expressed as $$H(S) = \frac{AK(S + 1/RC)}{(S^2 + AKS + AK/RC)}$$

where A is a gain factor that is less than or equal to unity, as controlled by the unit 402, and K is a loop gain constant which varies in proportion to the VCO frequency. It can be readily demonstrated that the loopwidth may be changed, without affecting the damping factor of the loop, if A and either R or C are varied in inverse proportion to each other. Typically, A and C can be varied in discrete steps. However, as noted in the Background portion hereof, switching of the loopwidth during operation can result in loss of data due to loss of lock caused by an offset voltage in the loopwidth filter when the loopwidth is switched. For example, in FIG. 2 assume a particular voltage exists across the capacitor C in the loop filter. To change loopwidth, another capacitor will typically be switched into the loop filter circuit (in place of C) and, simultaneously, the gain factor of loop filter will be changed. When this is done, a different voltage will be applied across the "new" capacitor. If the initial voltage applied across the new capacitor is not an appropriate value, the change in gain factor can result in a spurious error signal in the loop which causes lock to be lost.

Figure 3:
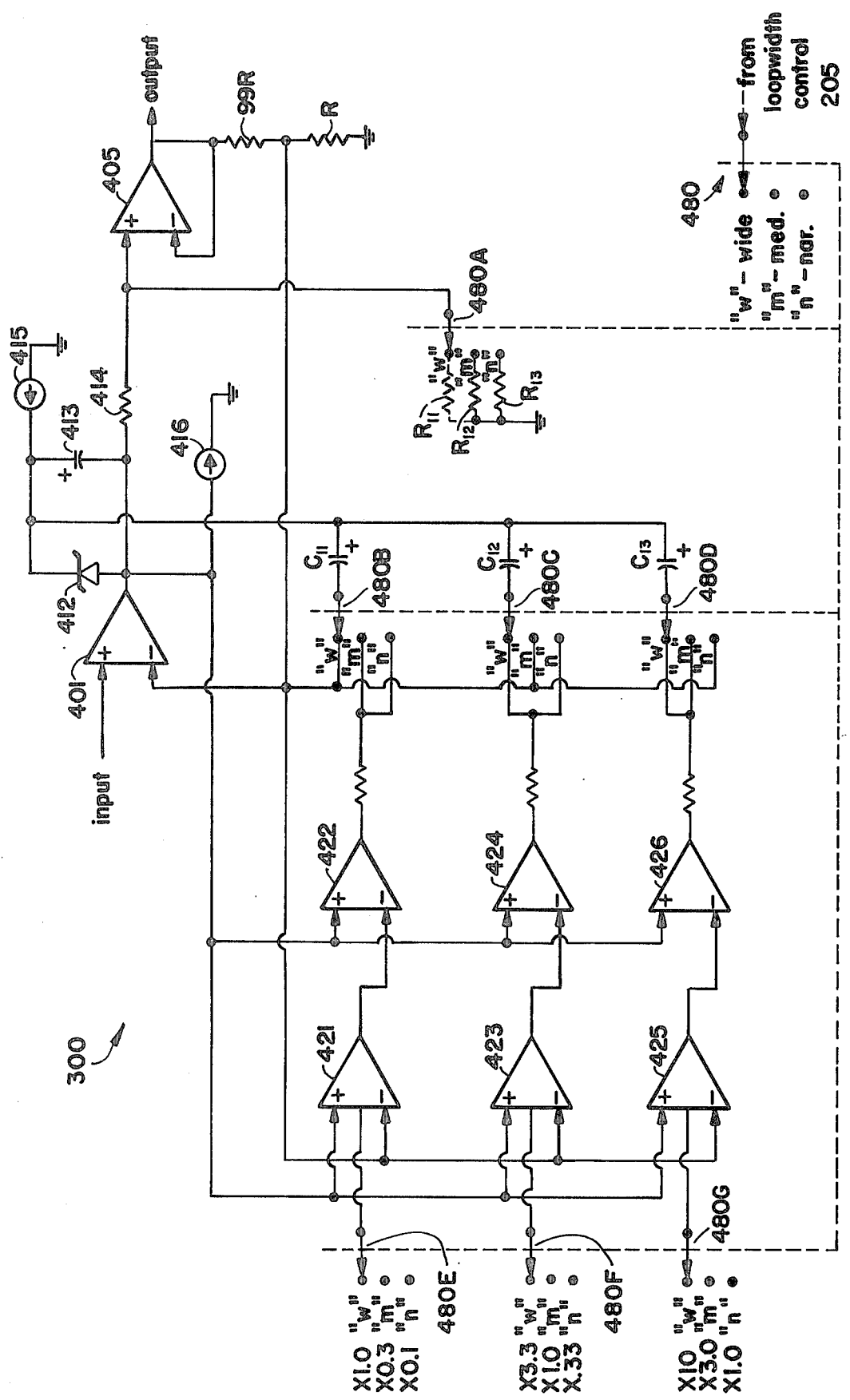
FIG. 3 illustrates a variable loopwidth filter in accordance with an embodiment of the invention.

Referring to FIG. 3, there is shown an embodiment of an adaptive loopwidth filter which includes a feature of the invention whereby capacitors are precharged to prevent loss of lock when switching to a different loopwidth. The operational amplifiers 401 and 405, and the resistors designated as 99R and R are the same as in FIG. 2. The resistor $R_1$ of the gain control network A of FIG. 2 is replaced by three individual resistors coupled to ground through a three position pole portion 480A of a switch 480. Depending on the switch position, one of three resistors designated $R_{11}$, $R_{12}$, and $R_{13}$ are coupled between the positive input terminal of amplifier 405 and ground reference potential. The capacitors $C_{11}$, $C_{12}$, and $C_{13}$ can be visualized as replacing the capacitor C of FIG. 2. By operation of the switch portions 480B, 480C and 480D of switch 480, one of these capacitors is seen to be coupled between the negative input terminal of operational amplifier 401 and a point which is a fixed voltage above the output of the operational amplifier 401. This fixed voltage may be, for example, 5.1 volts, by operation of the zener diode 412 and current sources 415 and 416. The positions of the various portions of switch 480 in the embodiment of FIG. 3 are under common control. The three positions of the switch are designated as "w" (wide), "m" (medium), and "n" (narrow) which represent the available loopwidth settings of the circuit for this embodiment. The control of the switch can be either manual or automatic, as effected by the loopwidth control circuit 205 (FIG. 1). It can be seen that when switch control is in the "w" (wide) position, resistor $R_{11}$ and capacitor $C_{11}$ are in the loop, when the switch control is in the "m" (medium) position the resistor $R_{12}$ and capacitor $C_{12}$ are in the loop, and when the switch control is at the "n" (narrow) position, the resistor $R_{13}$ and capacitor $C_{13}$ are in the loop. At relatively low frequencies of operation, such as are employed in a logging-while-drilling operation of the type described in the Background portion hereof, relatively high values of capacitance are employed. For example, $C_{11}$, $C_{12}$ and $C_{13}$ may respectively have values of 10, 33 and 100 microfarads. To avoid exceedingly large physical capacitor sizes, it is practical to employ electrolytic type capacitors, these capacitors requiring a bias voltage, as is provided in the circuit of FIG. 3 by bias current sources 415 and 416 and zener diode 412. A filter capacitor 413, which typically has a large value such as 220 microfarads, is coupled in parallel with zener diode 412. The individual resistors, $R_{11}$, $R_{12}$ and $R_{13}$, may have the values of infinite resistance (open circuit), 3.86 Kohms and 1.00 Kohms, respectively, and the resistor 414 may have a value of 9.09K.

Based on the portion of the FIG. 3 circuitry described thus far, assume that the adaptive loopwidth filter is operating in its "wide" loopwidth, that is with resistor $R_{11}$ (open circuit) and capacitor $C_{11}$ in the circuit. If the output of operational amplifier 401 is at a voltage $V_1$, and since the input impedance to operational amplifier 405 is very high, the voltage at the input of operational amplifier 405 is also approximately $V_1$. Assume now that loopwidth switch control of switch 480 is switched to the "medium" loopwidth position. The resistor $R_{12}$ will now form a voltage divider with the resistor 414. Since $R_{12}$ is only three-tenths of the total resistance of resistor 414 plus $R_{12}$, the voltage at the input to operational amplifier 405 would drop to a value of about $(0.3)V_1$. The output of operational amplifier 405 would therefore be instantaneously reduced to three-tenths of its previous value. This jump, by itself, could cause loss of lock since the output of amplifier 405 is coupled to the loop VCO (FIG. 1). The positive side of the capacitor $C_{12}$, which will be switched into the circuit, is 5.1 volts above voltage $V_1$ (as is the positive side of capacitor $C_{11}$ which is being switched out of the circuit). To avoid a sudden jump at the output of amplifier 405, the initial voltage across $C_{12}$ should be greater than the voltage was across $C_{11}$ by a factor of 10/3. Accordingly, and as will be described momentarily, the present invention provides appropriate precharging of the capacitors which are not currently operative in the circuit. However, a further consideration should be taken into account as follows: Two signal components are generally present in the loop filter circuit, namely an AC signal component and a DC or very low frequency error voltage. Since the positive-going side of all three capacitors, $C_{11}$, $C_{12}$, and $C_{13}$, are coupled to a common point (i.e. 5.1 volts above the output voltage of operational amplifier 401), care must be taken not to precharge the inoperative capacitors (i.e., those which are temporarily out of the circuit) to a fixed gain times both components, since the AC component is a common mode signal which should remain the same regardless of the selected loopwidth.

In the circuit of FIG. 3, a voltage representative of the voltage across the capacitor currently in the circuit is applied to each of a plurality of gain control amplifiers 421, 423 and 425. In particular, the voltage which is 5.1 volts below the voltage on the positive side of the capacitor currently in the circuit is applied to the positive input terminal of each of these amplifiers 421, 423 and 425, and the voltage at the negative input terminal of operational amplifier 401 (which is also the voltage at the negative side of the capacitor currently in the circuit) is applied to the negative input terminal of each of the amplifiers 421, 423 and 425. Three further portions of switch 480, designated 480E, 480F and 480G, are operative to apply one of three gain control inputs to a gain control terminal of each of the respective amplifiers 421, 423 and 425. In the present embodiment, the gain control multipliers applied to amplifier 421 for the switch positions "w", "m" and "n" are 1.0, 0.3 and 0.1, respectively. The gain control multipliers applied to the amplifier 423 for the switch positions "w", "m" and "n", are 3.3, 1.0 and 0.33, respectively. The gain control multipliers applied to the amplifier 425 for the switch positions "w", "m" and "n" are 10, 3.0 and 1.0, respectively. It will be understood that the gain control multipliers applied to the gain control amplifiers 421, 423 and 425, via the switch portions 480E, 480F and 480G, respectively, can be generated by any suitable means known in the art, such as by switching appropriate weighting resistors (not shown) into voltage divider circuits to obtain the desired gain multipliers.

The outputs of amplifiers 421, 423 and 425 are respectively coupled to the negative input terminals of operational amplifiers 422, 424 and 426. The positive input terminals of these amplifiers are each coupled to the output of operational amplifier 401, so they each receive a signal which is 5.1 volts below the voltage on the positive side of the capacitor currently in the circuit. The outputs of amplifiers 422, 424 and 426 are respectively coupled to two poles of the respective switch portions 480B, 480C and 480D. The three switch portions are seen to be arranged such that the negative terminals of the capacitors which are not currently operative in the loop filter circuit are coupled to the output of their respective amplifiers (422, 424 or 426). Specifically, capacitor $C_{11}$ is coupled to the output of amplifier 422 of the "m" and "n" switch positions, capacitor $C_{12}$ is coupled to the output of amplifier 424 for the "w" and "n" switch positions, and the capacitor $C_{13}$ is coupled to the output of the amplifier 426 for the "w" and "m" switch positions.

In operation, the switch 480 is seen to cause switching of the filter loopwidth by simultaneously switching in the appropriate gain factor (resistor $R_{11}$, $R_{12}$ or $R_{13}$) along with its corresponding capacitor ($C_{11}$, $C_{12}$ or $C_{13}$). The switch portions 480B, 480C and 480D also serve to apply the desired precharging voltages to those capacitors not currently in the circuit. This is achieved by the amplifiers 421 through 426. In particular, the positive terminals of these six amplifiers are coupled to a potential which is 5.1 volts above the voltage on the positive plates of each of the three capacitors $C_{11}$, $C_{12}$ and $C_{13}$. The negative input terminal of the amplifiers 422, 424 and 426 are coupled to the potential on the negative plate of the particular capacitor ($C_{11}$, $C_{12}$ or $C_{13}$) which is currently in the circuit. Since the outputs of amplifiers 421, 423 and 425 are respectively coupled to the negative input terminals of amplifiers 422, 424 and 426, it is seen that the common mode AC signal component is cancelled in the output of amplifiers 422, 424 and 426, and not applied as a precharging voltage.

An example of operation is as follows: Assume once again that the circuit is operating in the "wide" loopwidth, that is with $R_{11}$ (open circuit) and capacitor $C_{11}$ in the circuit. As described above, a switch to the "medium" loopwidth would require an initial voltage across $C_{12}$ (the "new" capacitor in the circuit) which is 10/3 (=3.3) times the value which had been applied across $C_{11}$ just before switching. It is seen that in this situation a gain control factor of 3.3 is applied to amplifier 423 via switch portion 480F. If switching were, instead, to the "narrow" loopwidth, the resistor $R_{13}$ switched into the circuit would, by itself, cause the input voltage to amplifier 405 to drop to 1/10 of its value just before switching. Accordingly, the gain control factor applied to amplifier 425 (affecting the precharging of capacitor $C_{13}$ which would be switched in in this situation) has a value of 10. The remaining gain control factors for the amplifiers 421, 422 and 423 can also be readily seen to have the appropriate values for each situation.

I claim:

1. For use in an electronic system which includes: a pair of terminals; a plurality of capacitors, each of said capacitors having one of its plates coupled to one of said terminals; switching means for coupling the other plate of a selected one of said capacitors to the other terminal; and variable gain means synchronized with said switching means and affecting the potential of said other terminal; a circuit for reducing transient signals that result from switching a different capacitor between said pair of terminals, comprising:
    means for continuously generating a reference voltage associated with each of said plurality of capacitors not presently coupled between said pair of terminals, each said generated reference voltage being a function of the voltage which would appear across its associated capacitor when said associated capacitor is instantaneously switched by said switching means between said pair of terminals; and
    means for continuously applying each said generated reference voltage across its associated capacitor.

2. The circuit as defined by claim 1 wherein said means for generating a reference voltage is responsive to the voltage currently across said pair of terminals and is also responsive to a ratio of the gain factors of said variable gain means.

3. The circuit as defined by claim 2 wherein said means for generating a reference voltage comprises a plurality of amplifier means, each of said amplifier means being responsive to the present voltage between said pair of terminals and being gain controlled in accordance with a ratio of said gain factors.

4. The circuit as defined by claim 1 wherein each of said plurality of capacitors is an electrolytic capacitor.

5. The circuit as defined by claim 3 wherein said means for generating a reference voltage comprises a plurality of amplifier means, each of said amplifier means being responsive to the present voltage between said pair of terminals and being gain controlled in accordance with a ratio of said gain factors.

6. The circuit as defined by claim 4 wherein the positive plate of each of said capacitors is coupled to said one of said pair of terminals and said one terminal is maintained at a positive voltage.

7. The circuit as defined by claim 5 wherein the positive plate of each of said capacitors is coupled to said one of said pair of terminals and said one terminal is maintained at a positive voltage.

8. A variable filter, comprising:
    a first amplifier having first and second input terminals, said first input terminal being adapted to receive an input signal;
    a second amplifier;
    variable gain control means for switchably coupling the output of said first amplifier to an input of said second amplifier, said variable gain control means having at least first and second different gain factors;
    variable capacitance means including at least first and second capacitors, one of which is switchable in concert with said variable gain control means to capacitively couple the output of said first amplifier to the second input terminal of said first amplifier;
    means for generating a reference voltage associated with the capacitor which is not currently operative in said variable capacitance means, said generated referenced voltage being a function of the voltage which would appear across the capacitor not currently operative when it is instantaneously switched into operation; and
    means for continuously applying the generated reference voltage across the capacitor not currently operative in said variable capacitance means.

9. The filter as defined by claim 8 wherein said means for generating a reference voltage is responsive to the voltage across the capacitor currently operative in said variable capacitance means and is also responsive to a ratio of said gain factors.

10. The filter as defined by claim 8 wherein said means for generating a reference voltage comprises first and second amplifier means respectively associated with said first and second capacitors, the amplifier means associated with the capacitor not currently operative being responsive to the voltage across the currently operative capacitor.

11. The filter as defined by claim 10 wherein each of said amplifier means is gain controlled in accordance with a different ratio of said gain factors.

12. The filter as defined by claim 8 wherein each of said plurality of capacitors is an electrolytic capacitor.

13. The filter as defined by claim 10 wherein each of said plurality of capacitors is an electrolytic capacitor.

14. The filter as defined by claim 10 wherein the positive plate of each of said capacitors is coupled to the output of said first amplifier and maintained at a positive potential.

15. For use in an electronic system which includes: a pair of terminals; a plurality of capacitors, each of said capacitors having one of its plates coupled to one of said terminals; switching means for coupling the other plate of a selected one of said capacitors to the other terminal; and variable gain means synchronized with said switching means and affecting the potential of said other terminal; a method for reducing transient signals that result from switching a different capacitor between said pair of terminals, comprising:

continuously generating a reference voltage associated with each of said plurality of capacitors not presently coupled between said pair of terminals, each said generated reference voltage being a function of the voltage which would appear across its associated capacitor when said associated capacitor is instantaneously switched by said switching means between said pair of terminals; and continuously applying each said generated reference voltage across its associated capacitor.

16. The method as defined by claim 15 wherein said generated reference voltage is responsive to the voltage currently across said pair of terminals and is also responsive to a ratio of the gain factors of said variable gain means.

* * * * *